United States Patent [19]

Baron

[11] Patent Number: 4,728,802
[45] Date of Patent: Mar. 1, 1988

[54] BALANCED DRIVE PHOTOSENSITIVE PIXEL AND METHOD OF OPERATING THE SAME

[75] Inventor: Yair Baron, Southfield, Mich.

[73] Assignee: Ovonic Imaging Systems, Inc., Troy, Mich.

[21] Appl. No.: 908,423

[22] Filed: Sep. 17, 1986

Related U.S. Application Data

[63] Continuation-in-part of Ser. No. 821,023, Jan. 21, 1986.

[51] Int. Cl.[4] .............................................. H01L 27/14
[52] U.S. Cl. ................................. 250/578; 358/213.11; 358/213.15; 358/213.27
[58] Field of Search ................ 250/578, 211 R, 211 J; 358/212, 213.11, 213.15, 213.16, 213.18, 213.27, 213.28; 357/30 H, 30 K, 31, 32

[56] References Cited

U.S. PATENT DOCUMENTS

| | | |
|---|---|---|
| 3,551,761 | 12/1970 | Ruoff et al. .............................. 357/32 |
| 3,654,606 | 4/1972 | Marlowe et al. . |
| 3,765,747 | 10/1973 | Pankratz et al. . |
| 4,644,338 | 2/1987 | Aoki et al. . |

Primary Examiner—Edward P. Westin
Attorney, Agent, or Firm—Marvin S. Siskind; Richard M. Goldman

[57] ABSTRACT

A photosensitive pixel includes a photogenerative element interconnected with a group of at least two series connected blocking elements, at a nodal point between the blocking elements. In a preferred embodiment, the capacitances of the individual blocking elements are substantially equal thereby enabling capacitive kick during the reading of the pixel to be reduced. The invention may be readily adapted to provide both linear and two dimensional pixel arrays having high accuracy, fast read times and high resolution. A method of operating the pixel using balanced driving signals is also disclosed.

16 Claims, 9 Drawing Figures

BALANCED DRIVE PHOTOSENSITIVE PIXEL AND METHOD OF OPERATING THE SAME

CROSS-REFERENCE TO RELATED APPLICATION

This is a continuation-in-part of copending U.S. patent application Ser. No. 821,023 filed Jan. 21, 1986 and entitled "Balance Drive Electronic Matrix System And Method For Operating Same", which is hereby incorporated by reference.

FIELD OF THE INVENTION

The present invention relates generally to an improved photosensitive pixels and a method of operating the same. More particularly, the pixels of the present invention may be arrayed to provide a linear array or matrix array (and specifically an array or matrix of photosensitive elements) which includes a plurality of photogenerative elements for providing a detectable signal and isolation means which allow the array to be rapidly addressed and read.

BACKGROUND

In many electronic matrix systems, an array of photosensitive pixels, each capable of providing a detectable output signal, are utilized for sensing the amount of light incident thereupon. Such matrix systems typically include both linear and two dimensional arrays. Each photosensitive pixel includes photogenerative element such as a phototransistor, photoresistor or photodiode for providing a detectable signal in response to the absorption of incident light and a blocking element for selectively blocking current flow through selected portions of the pixel so as to facilitate addressing. Each pixel has a capacitance useful for storing electric charge. In the most common type of photosensitive pixel, a predetermined amount of charge is stored across the pixel capacitance and is discharged by a photocurrent produced by light incident thereupon. The charge remaining on the pixel after a predetermined period of time has elapsed is indicative of the total amount of light sensed thereby. In an alternative and less common type of pixel, the photogenerative element is a photovoltaic device such as a p-i-n diode that is operated in the fourth quadrant of its I-V curve to allow the pixel to generate its own charge in response to light incident thereupon. The total amount of charge thus generated is similarly indicative of the total amount of light sensed thereby. Either technique may be utilized to provide a data stream representing the optical information sensed by the pixel. In this manner, an array of pixels may be utilized to scan a pattern of information such as alphanumeric information on a printed or written page, or a pattern on the surface of a workpiece and the like. Such scanners are available in a multitude of designs, including arrays made using single-crystal-silicon or gallium arsenide technologies, all thin film technologies, or hybrid technologies which combine thin film and single-crystal devices, and are well known to those of skilled in the art. Exemplary scanners made using thin film materials are described in U.S. Pat. No. 4,660,995 issued Apr. 2, 1987 and entitled "Contact-Type Document Scanner and Method", and in U.S. Pat. No. 4,675,739 issued June 23, 1987 and entitled "Integrated Radiation Sensing Array", the disclosures of which are incorporated herein by reference.

While single pixels are capable of sensing light incident thereupon and producing a corresponding signal, the utility of a single pixel imaging device is obviously limited. Typically, pixels are deployed in a linear or two dimensional array. A two dimensional array of pixels may be utilized to scan an information bearing surface in contact therewith, whereas a linear array may be moved relative to the image-bearing surface to provide a signal indicative thereof. In order to address an array of pixels, various multiplexing schemes are utilized, as detailed in an exemplary application U.S. patent application Ser. No. 885,897 filed July 15, 1986 and entitled "Signal Processing Apparatus and Method For Photosensitive Imaging System", the disclosure of which is incorporated herein by reference.

In a typical array, each pixel includes a blocking element or isolation device such as a diode, transistor or threshold switch disposed electrically in series with a photogenerative element. The blocking element assures that only electrical signals from preselected or addressed pixels are being read at any given time. When the pixel is sensing information, the photogenerative element produces an electrical signal, namely a photocurrent, which acts to dissipate the charge initially stored thereon. In the arrays using photovoltaic elements operated in the fourth quadrant, charge is cumulatively stored within the pixel. In either case, the blocking element prevents dissipation of the stored charge on the pixel. When the charge remaining or cumulatively stored in the pixel is to be read, the blocking element is rendered conductive, as for example by forward biasing a diode. The isolation element of each pixel has a capacitance associated therewith and this capacitance can degrade the operation of the pixel. For example, the capacitance of the blocking element can provide a charge of opposite polarity to that stored on the capacitance of the photogenerative element thus tending to decrease sensitivity of the pixel. This effect has been found in every multiplexing scheme heretofore utilized and is called the "capacitive kick" effect.

When the isolation device is switched from its off or blocking condition to its on or conducting condition to read the pixel by recharging the capacitance associated with the photogenerative element, the current required to dissipate the charge present on the isolation device cannot be distinguished from the current required to recharge the pixel capacitance. A similar and possibly more serious problem referred to as "capacitive kick back" occurs at the end of the read period when the isolation device is switched from its on condition to its off or blocking condition. Typically, the isolation device at this point has a significant voltage drop impressed across its current-carrying electrodes, which causes a significant transfer of charge from the capacitance of the photogenerative element of the pixel to the capacitance of the isolation element. This transfer of charge disturbs the desired voltage to be applied across the photogenerative element, and is not readily distinguishable from the current produced by reading the pixel and adversely affects the accuracy of the measurement of the light intensity incident on the pixel during the subsequent scanning cycle.

In conventional photosensitive arrays, the capacitive kick effect is always present and adversely affects the signal-to-noise ratio and accuracy of the reading obtained from the pixels. The magnitude of the capacitive kick back problem is directly related to the relative size or ratio of the capacitances of the photogenerative element and isolation element. The capacitance of circuit elements and devices is generally directly related to their physical size. For this reason, it is generally preferred in conventional designs that the relative areas of the photogenerative element to the blocking element be in a ratio of at least 5 to 1, and preferably 10 to 1 or more.

The capacitive kick becomes a significant problem severely limiting performance of high resolution photosensor arrays which include relatively small area photogenerative elements. The reason for the increase in the capacitive kick problem is that in such arrays the ratio of the areas of the photogenerative and blocking elements is significantly decreased. The desired larger ratios cannot be maintained because of constraints of lithography and processing which set a lower limit on blocking element size, particularly in large area arrays where yield problems become much more severe as minimum lithography feature sizes decrease. As a result, absolute sensitivity and speed of operation have heretofore been decreased as resolution of photosensitive pixel arrays has increased.

Obviously, it would be of great benefit to reduce or eliminate the capacitive kick effect. In accord with the principles of the instant invention, there is provided a pixel which includes a photogenerative element and a blocking means which includes at least two current blocking elements electrically interconnected in series relationship, such that the capacitive kick back effects of the blocking elements tend to cancel out. This is also believed to significantly reduce capacitive kick when the isolation means is switched from its non-conducting to conducting state. Since capacitive kick is thus significantly reduced or eliminated, sensitivity of the pixel and the accuracy with which it may be read are both significantly increased without as much regard to the relative sizes of the blocking elements and the photogenerative element. Moreover, this new pixel configuration allows the photogenerative element to be read much more quickly and with improved accuracy in comparison to conventional pixels having photogenerative and blocking elements arranged in series. The instant invention thus makes possible the fabrication of high resolution arrays of photosensitive pixels with manifest high photosensitivity and rapid read times.

These and other advantages of the instant invention will be apparent to those skilled in the art from the brief summary, the drawings, the detailed description of the drawings and the claims which follow.

BRIEF SUMMARY OF THE INVENTION

The instant invention provides a pixel for generating a detectable signal corresponding to the quantity of radiation incident thereupon. The pixel includes a photogenerative element and electrically interconnected isolation means for selectively blocking current flow through at least a portion of the pixel. In accord with the instant invention, the improvement comprises the isolation means including at least two current blocking means for cooperating to selectively block said current flow, said current blocking means being electrically interconnected in series relationship and the photogenerative element electrically connected to the isolation means at a nodal point between said series interconnected blocking elements, whereby the sensitivity or reading speed of the pixel is improved. Each of the current blocking means may be comprised of at least one current blocking element, or of only one current blocking element. However, each current blocking means may also be any suitable electronic circuit or structure capable of selectively switching current off and on in response to an applied signal or signals. The pixel may be operatively designed or constructed so that the capacitive kick back effect is substantially reduced or eliminated.

In accord with one embodiment of the instant invention, the current blocking elements of the pixel have at least one substantially similar static operating point on their respective I-V curves. In yet another embodiment, the current blocking elements have substantially similar dynamic operating characteristics, while in other embodiments they are substantially identical.

The current blocking elements may be transistors or diodes including Schottky barrier diodes. The diodes may include oppositely doped layers formed of thin film semiconductor material, and in some instances may include a layer of substantially intrinsic semiconductor alloy material interposed between the oppositely doped layers so as to form a p-i-n type diode. The blocking elements may include a layer of semiconductor material chosen from the group consisting essentially of amorphous silicon alloy materials, amorphous germanium alloy materials and amorphous silicon germanium alloy materials.

In yet another embodiment, the current blocking element may be a bidirectional threshold device comprised of a first layer of semiconductor material, a second layer of semiconductor material overlying the first layer and a third layer of semiconductor material overlying the second layer; the first and third layer may, in some instances, comprise doped semiconductor materials.

The photogenerative element of the pixel may be a phototransistor, a photoresistor or a photodiode, including a Schottky barrier diode. In some instances the photodiode may include layers of oppositely doped thin film semiconductor alloy material and in yet other instances may include a layer of substantially intrinsic semiconductor alloy material interposed between the oppositely doped layer so as to form a p-i-n type diode.

The isolation means may, in some instances, comprise at least four current blocking elements electrically interconnected in series relationship so that any short circuit defect occurring in one of the blocking elements will not render the isolation means inoperative. In yet other instances, the isolation means may include two groups of current blocking elements disposed in a parallel relationship, each group comprised of at least two series connected blocking elements. In this manner, electrical defects in the nature of opens will not render the isolation means inoperative.

In accord with another embodiment of the instant invention there is provided an electronic matrix of photosensitive pixels for providing a detectable electrical signal by selected ones of a plurality of photogenerative elements. The matrix includes a plurality of address line pairs, each pixel adapted to be addressed by selected pairs of said lines. Each pixel of the array includes a pair of blocking elements coupled together in series relationship at a common node and in electrical communication with at least one of the address lines associated with the pixel. The pixel further includes a photogenerative element in electrical communication with the common node and at least one of the address lines of that pixel. The pixels may be arranged as a two dimensional matrix array or as a linear array.

One other aspect of the present invention provides an improved method of operating a pixel arranged to provide a detectable signal corresponding to the quantity of radiation incident thereupon. The pixel to be operated includes a photogenerative element and isolation means electrically interconnected at a common node for selectively blocking current flow through at least a portion of the pixel. The improvement in the method of operating the pixel comprises the step of applying operating potentials to the isolations means and the photogenerative element such that for at least part of the time the isolation means is in a current conducting condition only a portion of the current flowing through the isolation means flows through said photogenerative element. The applying step may and preferably does include applying a first operating potential to said isolation means by applying a first pair of voltages which are distinct and opposite in polarity from one another with respect to a desired voltage to be obtained at the common node to place the isolation means in a current conducting condition such that current may flow between the photogenerative element and the node to obtain the detectable signal from the pixel.

The method of the present invention may also further comprise the step of applying a second operating potential to the isolation means by applying a second pair of voltages which are distinct and opposite in polarity from one another with respect to the desired voltage to place the isolation means in a current blocking condition. The first pair of voltages preferably are of substantially equal magnitude with respect to the desired voltage. The second pair of voltages are also preferably of substantially equal magnitude with respect to the desired voltage.

BRIEF DESCRIPTION OF THE DRAWINGS

FIG. 3A is a current versus voltage curve to illustrate the high current capability and operation of an isolation means of the present invention when turned on;

DESCRIPTION OF THE PREFERRED EMBODIMENTS

Figure 1:
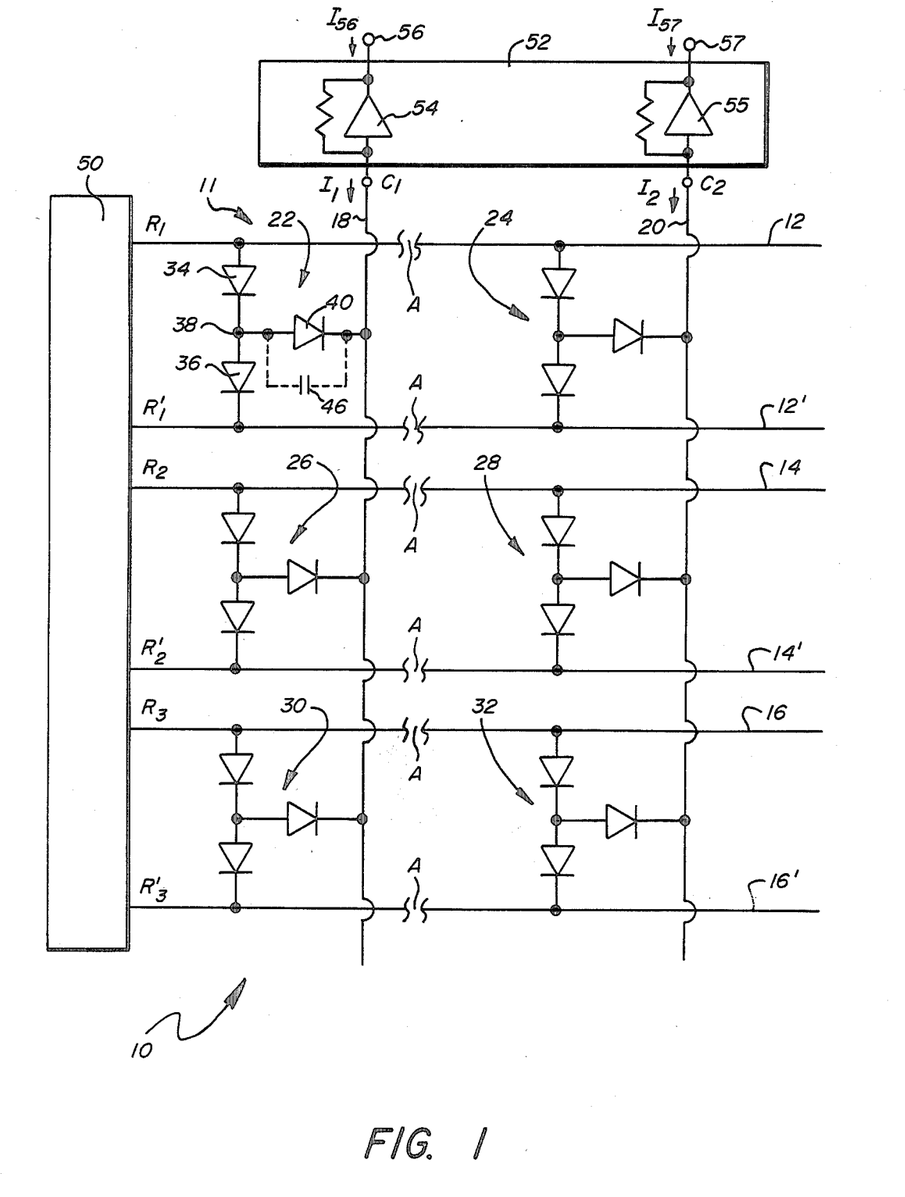
FIG. 1 is a schematic circuit diagram of an electronic matrix system embodying the present invention.

Referring now to FIG. 1, it illustrates in schematic circuit diagram form an electronic matrix system 10 embodying several pixels of the present invention. For purposes of this preferred embodiment, the electronic matrix system 10 takes the form of a photosensitive array 11 such as a document scanner. The break lines A are indicative of the fact that while a two dimensional (2D) array which can be read in parallel fashion is shown, a linear array which could be read using a single multiplexed output line 18 could be similarly fabricated. The array 11 of system 10 includes a plurality of address line pairs 12, 12', 14, 14', 16 and 16' which are electrically in parallel and may be called row select lines, and a plurality of output lines 18 and 20 which are electrically in parallel with one another and may at times be called column address lines. In two dimensional photosensitive arrays, the column address lines 18 and 20 typically cross the row select address line pairs at an angle such as ninety degrees and are spaced from the row select address line pairs to form a plurality of insulated crossover points therewith. In linear photosensitive arrays, the row select lines and one or more output lines may still be electrically arranged with respect to one another in a matrix form, if desired, to define electrically distinct locations for pixels similar to that of two dimensional arrays. Accordingly, it will be appreciated that the schematic diagram of FIG. 1 applies equally to photosensitive arrays which are physically arranged in either one or two dimensions.

Since the pixels of array 11 are preferably substantially identical, only pixel 22 will be described in detail herein. Pixel 22, as can be seen in the Figure, includes isolation means comprised of two blocking elements, such as a pair of isolation devices 34 and 36 which are coupled together at a common node 38. The isolation devices 34 and 36 may take the form of blocking diodes as shown, which are coupled together in nonopposing series relation between the row select address line pair 12 and 12'. Although the isolation devices in accordance with this preferred embodiment take the form of diodes, in practicing the present invention, the isolation devices can be any isolation device which provides a high impedance to current flow when reverse biased or turned off and a comparatively low impedance to current flow when forward biased or turned on. As will be described subsequently with respect to the embodiments of FIGS. 4 and 5, it will be noted that the isolation devices in accordance with those embodiments take the form of bidirectional threshold devices and transistors such as field effect transistors.

The pixel 22 further includes a photogenerative element 40, which is adapted to absorb incident radiation and provide a detectable signal corresponding to the total amount of said radiation. The photogenerative elements 40 of FIG. 1, are illustrated as being photodiodes, although other elements such as photoresistors and phototransistors may be similarly employed. The photodiode 40 of each pixel is electrically connected to the common node 38 formed by the blocking diodes 34, 36 and to its respective column address line.

A capacitance is provided with or inherent in each element 40 for the storage of charge thereupon. When element 40 is a vertically arranged photodiode, the electrodes of the diode itself typically form and provide the desired amount of capacitance. If the element 40 does not have sufficient inherent capacitance, a separate capacitor, preferably integrally formed adjacent to the element 40 and as part of the pixel, may be provided in any conventional or suitable form well known or available to those in the art. How to provide a desired amount of capacitance at element 40 is well understood in the art and need not be further described here. For convenience, the capacitance provided with or inherent in element 40 is shown in phantom in FIG. 1 as capacitor 46 and is coupled between the common node 38 and the column address line 18 in parallel with element 40.

The diodes 34 and 36 are Schottky barrier diodes, p-n devices or p-i-n devices, and in thin film photosensitive arrays are preferably vertically arranged, are preferably formed from layers of deposited semiconductor materials, and are preferably amorphous semiconductor alloy materials. In preferred thin film embodiments of the pixels of the instant invention, the diodes 34 and 36 are preferably formed as p-i-n diodes which include a layer of doped amorphous silicon alloy, a substantially intrinsic amorphous silicon alloy overlying the doped layer, and a further doped layer of amorphous silicon alloy overlying the substantially intrinsic layer.

The system 10 further includes a row select driver 50 having outputs $R_1$, $R_1'$, $R_2$, $R_2'$, $R_3$ and $R_3'$ coupled to the row select address line pairs 12, 12', 14, 14', 16 and 16'. The row select driver 50, as will be described subsequently, provides drive signals at its outputs to apply first operating potentials which are preferably substantially equal in magnitude and opposite in polarity about the desired center node voltage to the row select address line pairs to forward bias or turn on the isolation devices to in turn facilitate the reading or storage of charge in the photogenerative elements coupled thereto. The row select driver also applies second operating potentials which are preferably substantially equal in magnitude and opposite in polarity between the row select address line pairs to reverse bias or turn off the isolation devices to prevent loss of the charge stored in the storage elements coupled thereto through the isolation devices.

Lastly, the system 10 includes an output amplifier circuit 52. The amplifier circuit 52 includes a plurality of current amplifiers 54 and 55 respectively, having inputs $C_1$ and $C_2$, which are coupled to the output address lines 18 and 20 respectively. For convenience, the output address lines of array 11 will often be referred to as column address lines. The output circuit 52 preferably maintains the inputs $C_1$ and $C_2$ at virtual ground, that is at zero volts, while amplifying currents $I_1$ and $I_2$ produced by charging or recharging of the capacitances of the pixels associated with column lines 18 and 20 respectively. Maintaining all output lines at virtual ground helps eliminate cross-talk between groups of pixels in array 11, as is fully described in copending U.S. patent application Ser. No. 907,926 filed on Sept. 16, 1986 in the names of K. Kitamura, et al. and entitled "Photosensitive Element With Exposed Blocking Element", which is hereby incorporated by reference. The current amplifiers 54 and 55 which may be operational amplifiers provided with feed back resistors as shown, have output terminals 56 and 57 which, depending upon the type of amplifier circuit used, may produce either an amplified current or voltage signal directly proportional to the unamplified currents $I_1$ and $I_2$ respectively.

Figure 2:
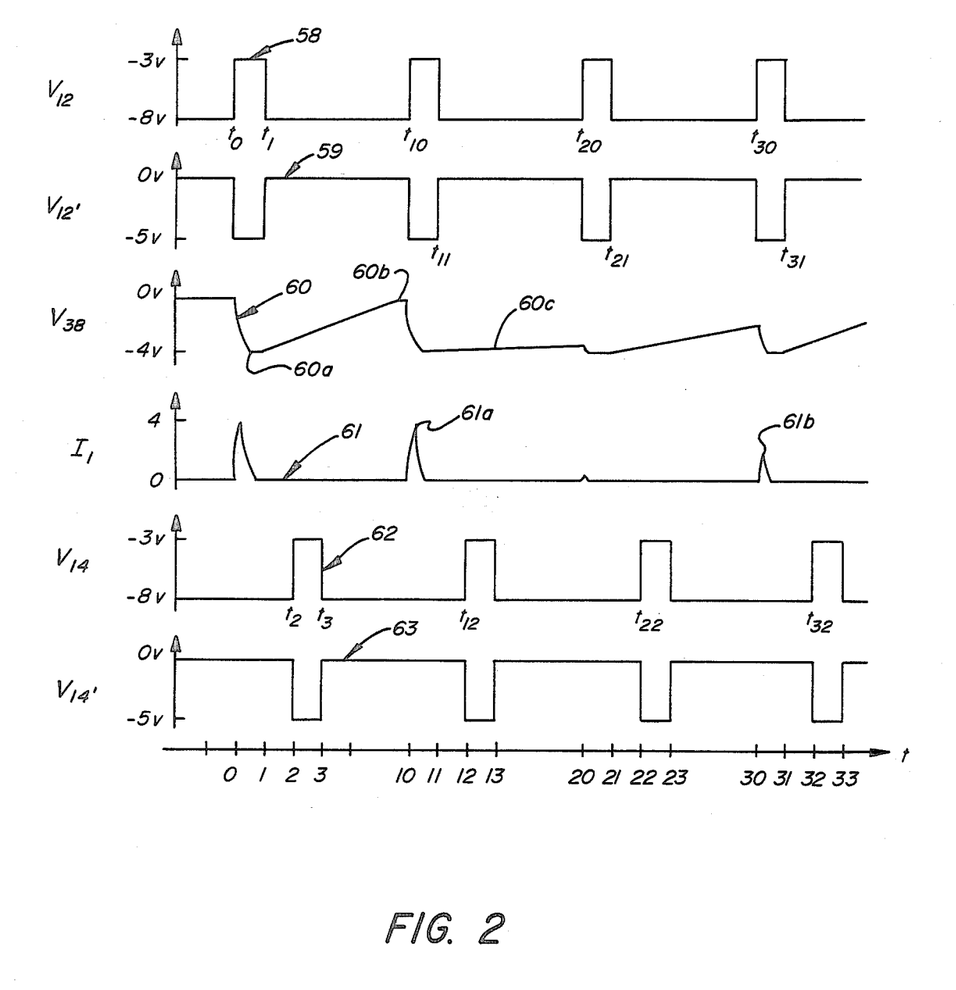
FIG. 2 is a series of signal waveforms illustrating a preferred method of operating the matrix system of FIG. 1.

FIG. 2 is a series of signal waveforms presented along a common time line which illustrates a preferred mode of operating pixels 22, 24, 26 and 28 of the present invention. Those in the art will appreciate that all the pixels in the system 10 may be similarly operated. The first two or uppermost waveforms 58 and 59 are voltage waveforms which respectively illustrate the voltages or operating potentials applied to row select lines 12 and 12'. The next waveform 60 is a voltage waveform which represents the voltage of the common node 38 due to the charging and discharging of the capacitor 46 of the pixel 22 as the column line to which it is connected is maintained at zero volts. The next waveform 61 represents the unamplified current $I_1$ flowing into the pixel 22 from column line 18 as a result of the operating potentials applied to the row select lines 12 and 12'. The final two waveforms 62 and 63 represent the voltages or operating potentials which may be applied to the second pair of row select lines, namely lines 14 and 14' to operate pixels 26 and 28.

The waveforms of FIG. 2 illustrate the initial charging of the pixel 22 between times $t_0$ and $t_1$, and three successive complete scanning cycles of operation of pixel 22 wherein the capacitance 46 of element 40 is successively fully discharged, fully retained, and partially discharged. Each scanning cycle or frame has two distinct portions, namely a non-read or light integrating portion wherein the charge stored on the element 40 is discharged by photocurrents caused by light incident thereupon and a read portion during which time the total amount of charge which has been dissipated due to the generated photocurrents is read by the recharging of the element 40. In this regard the total amount of charge required to recharge the capacitance of the element is proportional to the total amount of radiation incident upon the diode during the scanning cycle. Since the photogenerative element effectively integrates the total amount of photocurrent produced by the incident light on the photosensor over each scanning cycle, it is much more sensitive than prior art photosensors which measure incident light on an instantaneous basis. In the illustration of FIG. 2, the common node 38 is charged during the read portion of each cycle to −4 volts. The voltage values given are arranged to achieve this −4 volt value on common node 38 when the blocking devices 34 and 36 and the photogenerative element 40 are amorphous silicon alloy p-i-n diodes which may have p and n layers in the range of 200 to 500 angstroms thick for example, and an i layer which is sufficiently thick to achieve the desired reverse-bias breakdown voltage rating, such as 3000 to 8000 angstroms thick, and preferably 4000 to 6000 angstroms thick. Those in the art should appreciate, however, that the voltage levels and current indicated in the graphs of FIG. 2 are only meant to illustrate the operation of the pixel 22 and its associated driving circuits, and any suitable similar or equivalent driving voltage levels may be utilized. Armed with the foregoing understanding, the typical operation of pixel 22 and its associated driving circuits will now be explained.

At $t_0$, the row select driver 50 applies −3 volts to the row select address line 12 and −5 volts to the row select address line 12' to forward bias the diodes 34 and 36. Preferably, the diodes 34 and 36 are matched devices having the same static and/or dynamic I-V characteristics as will be further explained. This may be achieved by making diodes 34 and 36 of equivalent size, shape and thickness and by forming them simultaneously, in the typical manner used by those skilled in the art for producing matched electronic devices of various types. With the diodes 34 and 36 thus switching to their forward biased condition, the voltage at common node 38 quickly drops to and stabilizes at −4 volts, thus placing −4 volts across the element 40 which fully charges the capacitance 46 of element 40. The rate of charging of the capacitance of element 40 is determined by the amount of current available on an instantaneous basis from column address line 18, by the dynamic current-voltage (I-V) characteristics of the diodes 34 and 36, and by how hard diodes 34 and 36 are driven. Accordingly, as shown in voltage waveform 60 and current waveform 61, a small finite amount of time is required to cause the voltage at node 38 to reach −4 volts at point 60a. Note that just before time $t_1$, the end of the period of time that the isolation diodes 34 and 36 are in their current conducting state or condition, an appreciable current is still flowing through both isolation diodes, although no appreciable current is flowing through the photogenerative element 40. At $t_1$, the row select driver returns address line 12 to −8 volts and address line 12′ to zero volts as shown in waveforms 58 and 59 to back bias the diodes 34 and 36. Preferably, the capacitances of the isolation diodes 34 and 36 are made substantially or precisely equal, so that there is no current flow between node 38 and element 40 as the diodes 34 and 36 are switched off.

With the diodes 34 and 36 thus reverse biased, the charge just stored across capacitance 46 will not be lost through the diodes 34 and 36 which are now in a blocking condition. During the non-read portion of the scanning cycle, photocurrent is generated in element 40 in proportion to the total amount of light incident thereupon. This photocurrent causes the charge stored across the capacitances of diodes 36 and 40 to decrease, and the charge stored across the capacitance of diode 34 to increase. The magnitude of the reduction of voltage node 38 is proportional to the net charge transfer.

As shown in FIG. 2, the non-read portion of the first scanning cycle for pixel 22 lasts from time $t_1$ to time $t_{10}$. As shown in voltage waveform 60, the photodiode 40 is completely discharged at point 60b just before the end of the non-read portion of the first scanning cycle. Accordingly, when the diodes 36 and 38 are once again forward biased between times $t_{10}$ and $t_{11}$, the amount of current $I_1$ required to recharge capacitance 46 is at a maximum. This condition can be detected for example by sampling the peak amplitude 61a of the current required to recharge photodiode 40. Because the unamplified current $I_1$ is so small, such sampling is best done by sensing the amplified current or voltage available at output terminal 56 of amplifier 54.

In the second scanning cycle of pixel 22 which lasts from time $t_{11}$ to $t_{21}$, the waveform 60 shows that little or no light is incident upon the photodiode 40. Accordingly the capacitance 46 of pixel 22, which was recharged to −4 volts between times $t_{10}$ and $t_{11}$, remains at about −4 volts. The dark current of the photodiode or other leakage paths within element 40, or the reversed biased currents of the blockings diodes 34 and 36, may result in the loss of a very small amount of charge on capacitance 46, as indicated by the slight rate of discharge illustrated by portion 60c of waveform 60. However, when the photodiode 40 and blocking diodes 34 and 36 are properly designed, these are very low level currents which do not appreciably discharge the capacitance 46 of element 40.

In the third scanning cycle of pixel 22 from $t_{21}$ to $t_{31}$, the waveform 60 shows that the photodiode 40 is only partially discharged due to a reduced level of incident light. Specifically, at time $t_{30}$ the voltage across photodiode 40 is at about −2 volts. Accordingly, the size of the current pulse between time $t_{30}$ and $t_{31}$ is proportionately smaller. Thus, it will be appreciated that pixel 22 is well suited to provide an analog current output whose level, as sensed or detected during the read portions of the scanning cycle, corresponds directly to the total amount of radiation incident upon its photogenerative element 40.

Those in the art should appreciate that the diode pairs associated with the pixels only need to be driven in the balanced fashion described above and further described below, and forward biased sufficiently to establish the desired common node voltage, such as −4 volts illustrated in FIG. 2, to achieve the improved sensitivity offered by the present invention.

Waveforms 62 and 63 illustrate the voltage and timing of the driving signals applied to the second pair of row select lines 14 and 14′. The pixels 26 and 28 in the second row of array 11 may be read between times $t_2$ and $t_3$ as shown in FIG. 2. Alternatively the pixels 26 and 28 may be read between times $t_1$ and $t_2$, if desired, to minimize the interval of the time between the reading of the pixels of successive rows. Those in the art will appreciate that time units shown in FIG. 2 may widely vary such as from nanoseconds to milliseconds. Furthermore, it will be appreciated that the non-read portion of the scanning cycle may be one to several orders of magnitude (e.g., two to four orders or more) longer than the read portion of the scanning cycle.

Figure 3A:
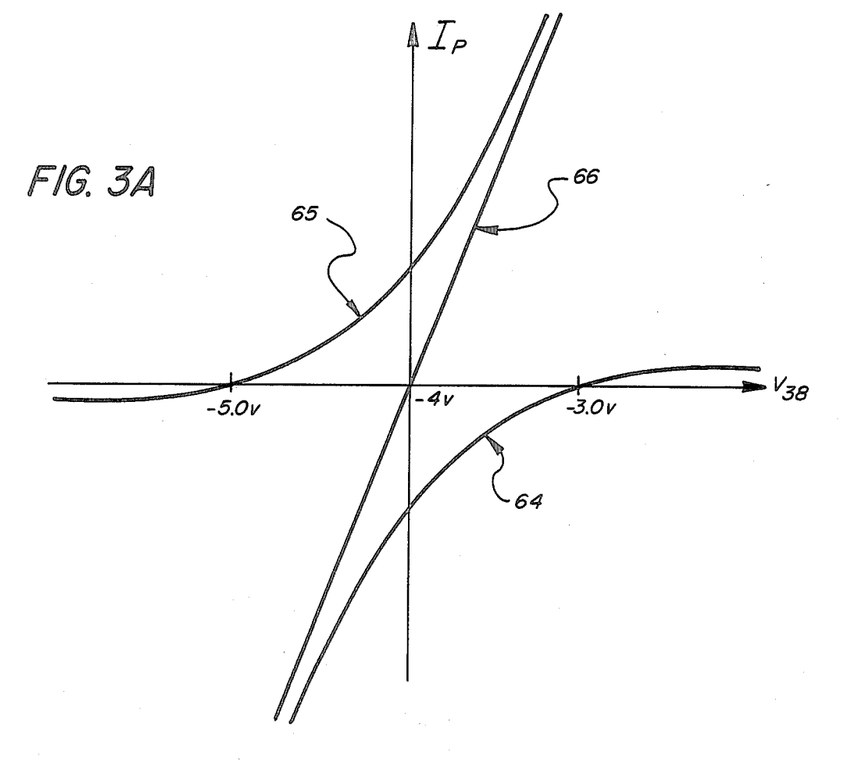
Figure 3B:
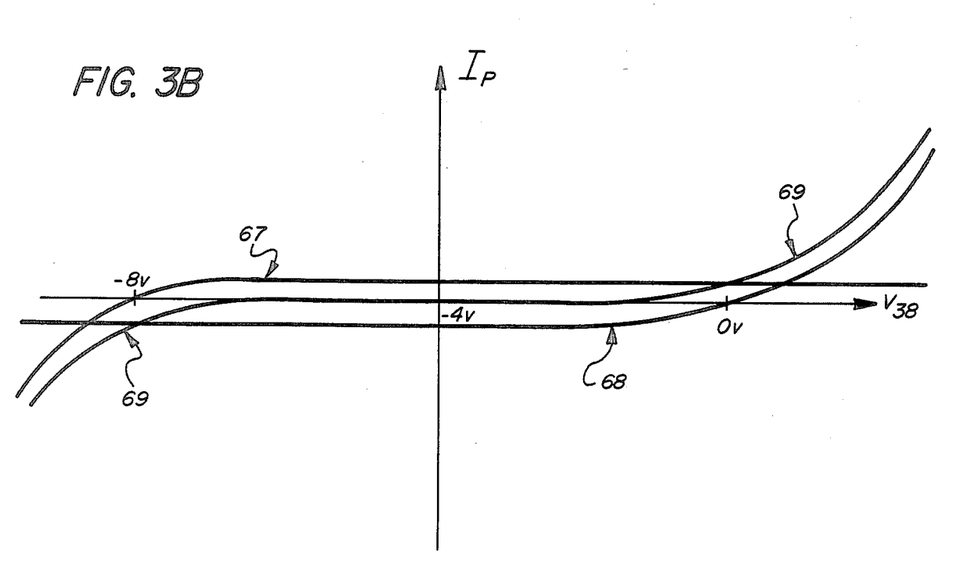
FIG. 3B is another current versus voltage curve to illustrate the high impedance condition or off state of an isolation means of a pixel of the present invention.
Figure 3C:
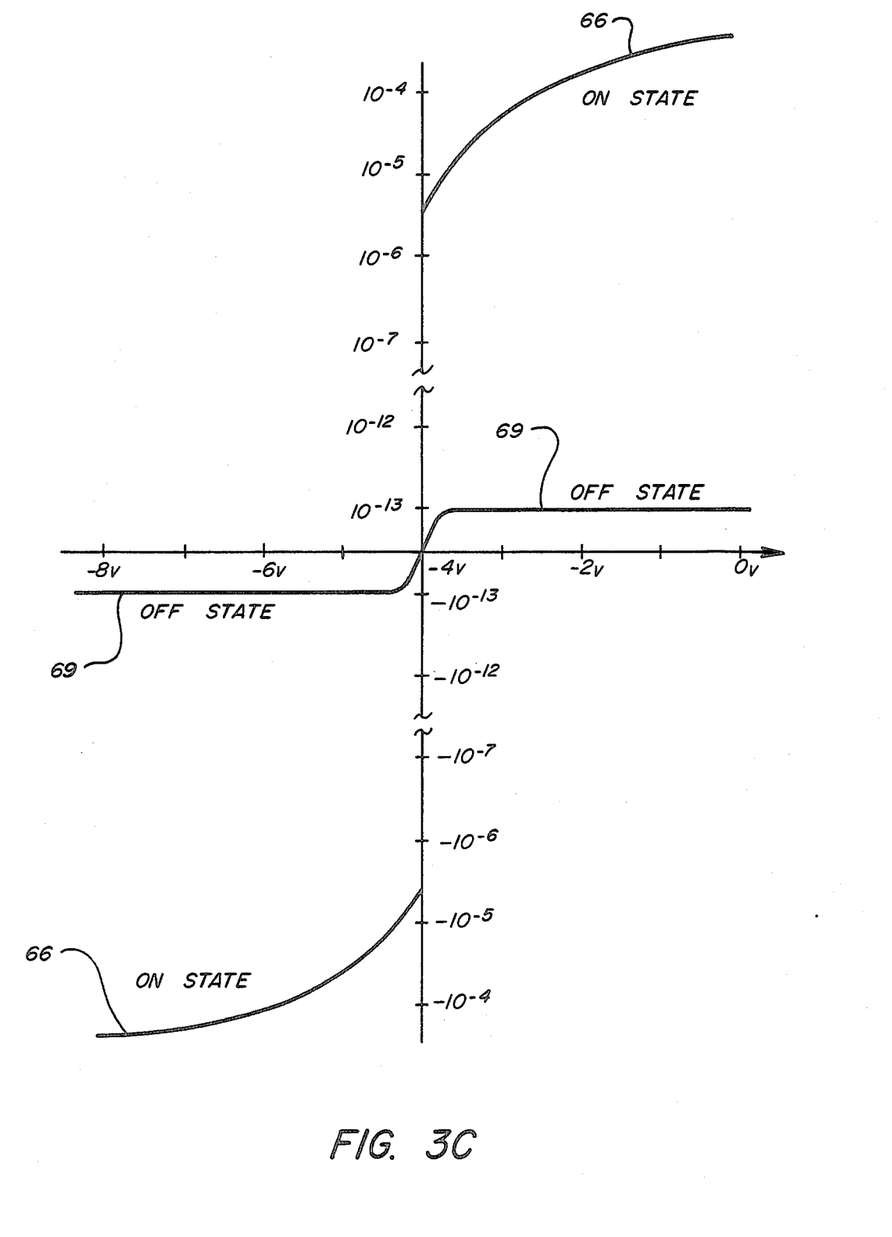
FIG. 3C is another current versus voltage curve illustrating the switching characteristics of a two diode isolation means when the diodes are forward or reverse biased together in accordance with the present invention.

The pixels of the present invention which feature improved isolation means having a plurality of interconnected isolation devices and a common node to which a photogenerative element is connected has several important advantages over the conventional prior art pixels which feature a single isolation or blocking device in series with the photoresponsive element. First, the use of a plurality of isolation or blocking elements arranged about a common node to accept or supply current from a photosensitive element enables the pixels of the present invention to be read or charged more quickly than pixels of conventional design. This advantage is further explained with respect to FIG. 3. Second, the balanced node approach of the present invention substantially eliminates or drastically reduces the capacitive kick problem of the prior art series arrangement of photogenerative elements and blocking devices. Third, the present invention permits high performance, high density photosensitive arrays to be constructed using isolation devices which need not be significantly smaller than the area of the photogenerative elements which they service.

The balanced node approach of the present invention overcomes the capacitive kick problem in the following manner. The present invention provides an isolation means which allows the common node 38 to be maintained at the same voltage as the isolation devices 36 and 38 are switched from their on or conducting state to their off or nonconducting state. Since the driving voltages are balanced, that is of equal magnitude and opposite polarity relative to the voltage of node 38, the transient currents flowing through the isolation diodes 34 and 36 are also balanced, and these transient currents cancel one another. Thus, there is no current flow into the element 40, so the voltage at node 38 remains at a constant potential immediately after the end of the read portion of the cycle, i.e., just after the isolation devices have switched from their conducting to nonconducting state. The pixel structure of the present invention is preferably constructed so that the effective capacitances of the isolation devices, as seen or measured from the common node to which photogenerative element 40 is connected, are precisely or substantially equal to achieve foregoing equal and opposite currents. It is by providing substantially equal capacitances and driving the isolation devices on either side of the common node at substantially equal and opposite potentials about the voltage initially desired on the common node at the beginning of the scanning cycle, that transient currents folowing through the isolation devices as they are switched from on to off effectively cancel one another out. In a similar fashion, the transient currents when the isolation devices are switched from their nonconducting to conducting state at the beginning of the read portion of the cycle also substantially cancel one another out. Accordingly, those in the art will appreciate that the present invention makes the size of the capacitances of the isolation devices relative to the capacitance of photogenerative element 40 less important to the sensitivity of the photogenerative element or the accuracy with which it may be read. Accordingly, in the pixels of the present invention it is not as necessary to maintain the previously mentioned minimum ratios between the size of the area of the photogenerative elements and blocking elements to control capacitive kick problems, as it is in conventional pixels.

As large area linear or matrix arrays of photosensitive elements, such as those 50 cm to 200 cm or more in length, it is strongly preferred to maintain minimum feature sizes of the blocking devices associated with the photosensitive elements relatively large, such as five or ten microns, because smaller feature sizes result in yield problems during the manufacturing process of such large area arrays. Accordingly, the capacitive kick effect imposed a limitation in conventional arrays on how small the photosensitive elements may be made. Since the balanced drive approach of the present invention substantially eliminates the capacitance of the isolation devices as a consideration, the isolation devices may be made significantly larger than in conventional designs. Thus, the present invention allows very high density photosensitive matrix or linear arrays to be made with relatively large minimum feature sizes.

Referring now to FIG. 3A, the curves there shown dramatically illustrate the higher speed operation that is possible when fabricating photosensitive arrays in accordance with the present invention. The curves of FIG. 3A illustrate the effect of having both diodes 34 and 36 of the pixel 22 of FIG. 1 forward biased during the charging of its capacitance 46. For the purpose of interpreting the curves of FIG. 3A, $I_p$ is the current flowing into the common node 38 through the capacitance 46 and $V_{38}$ is the voltage at node 38. Curve 64 is the current versus voltage characteristic of diode 34 alone when line 12 is maintained at $-3.0$ volts. As can be noted, when the voltage $V_{38}$ becomes more negative than the $-3.0$ volts on line 12, the current increases nonlinearly in a negative direction. Similarly, curve 65 is the current versus voltage characteristic of diode 36 alone when line 12' is maintained at $-5.0$ volts. As can be noted, when the voltage $V_{38}$ becomes more positive than the $-5.0$ volts on line 12', the current increases nonlinearly in a positive direction. Combining the curves 64 and 65 results in a "load" line curve 66 which represents the combined current versus voltage characteristic of diodes 34 and 36 when they are forward biased by having lines 12 and 12' maintained at $-3.0$ volts and $-5.0$ volts respectively. As can be noted, with both diodes forward biased and conducting, the curve 66 has a very steep slope showing that considerable current can flow through the element 40 even when relatively low voltages are applied across the element.

The size of the diodes 34 and 36 may be arranged so that the current $I_p$ through element 40 is only a fraction of the current flowing through diodes. When so arranged, the diodes 34 and 36 will both quickly assume and remain in their forward biased condition as capacitance 46 is charged. The voltage at node 38 quickly approaches and arrives at the desired $-4$ volts condition, where it remains even as the diodes are once again being reverse biased. Typically, given matched isolation devices 34 and 36, the voltage at node 38 will be at the desired voltage with an accuracy of plus or minus several tens of millivolts or less. The relatively sizable current through the diode also means that effective impedance of node 38, as viewed from element 40, is considerably lower than in a conventional series arrangement of blocking diode and photodiode, thus allowing much more rapid charging of the element 40. Alternatively stated, by using a plurality of isolation devices as described above the initial low current nonlinear portion of I-V characteristics of the individual isolation devices may be substantially avoided. Thus, very high speed reading of the photogenerative elements is possible. For example, in thin film photosensitive arrays using amorphous silicon alloy p-i-n diodes for the isolation diodes and photogenerative elements, the charging or read time for a pixel can theoretically be on the order of 500 to 100 nanoseconds or less.

Referring now to FIG. 3B, the curves there shown dramatically illustrate the improved operation of the matrix in accordance with the present invention when the diodes 34 and 36 of the pixel 22 of FIG. 1 are back biased during the non-read portion of scanning cycle of retention of the charge stored within pixel 11. Curve 67 is the current flowing into node 38 as a function of the voltage at node 38 when line 12 is held at $-8$ volts. As can be noted, when the voltage $V_{38}$ is more positive than the $-8$ volts on line 12, the current through the diode 34 is represented by only leakage current, which typically is very low (e.g., orders of magnitude lower than the diodes on current). Similarly, curve 68 is the current flowing into node 38 as a function of the voltage at node 38 when line 12' is held at zero volts. Curve 69 is the summation of curves 67 and 68, and shows in the central region thereof between $-8$ volts and zero volts on node 38 that even the leakage currents of the diodes 34 and 36 tend to cancel one another. As a result, as long as the voltage across storage element 46 remains between $-8$ volts and zero volts (or other suitable voltages designed to reverse bias the diodes), very little current will flow from the element 40 through either of the diodes 34 and 36, and thus the diodes will efficiently block the loss of charge stored or developed across element 40 through themselves.

Referring now to FIG. 3C, there is shown one illustrative set of switching characteristics of the diodes 34 and 36 when the diodes are forward biased together (the on-state) and reverse biased together (the off-state) by substantially equal and opposite voltages arranged about the desired common node voltage such as $-4$ volts, in accordance with the present invention. Curves 66 and 69 in FIG. 3C are simple an alternative presentation of the curves 66 and 69 of FIGS. 3A and 3B plotted on a semi-logarithmic scale to show the extremely large on-to-off ratio of the isolation means used in the pixels of the instant invention. As can also be noted, an on to off ratio of many orders of magnitude can be realized by the switching of diodes 34 and 36 between their forward and reversed biased conditions in accordance with the present invention. The number of orders of magnitude by which the on and off currents vary also depends on how low the leakage currents of the diodes 34 and 36 are.

As can be seen from the foregoing, the system of the present invention can be referred to as a balanced drive system inasmuch as the operating potentials applied to the row select address line pairs are always substantially equal but opposite in polarity about or around a desired common node voltage for optimum performance. Assuming that the diodes 34 and 36 have substantially identical I-V characteristics and capacitances, a voltage value of substantially representing the desired common node voltage will be precisely maintained at the common node 38, at least when the diodes are forward biased and the element 40 has been charged or recharged and before photo- currents induced by light incident on the element 40 change the amount of charge therein stored. Thus, the actual voltage applied at node 38 to element 40 is not significantly influenced by the voltage drop across and/or parasitic charge build-up on the isolation means for a photogenerative element as in earlier photosensitive array systems.

In accord with the principles of the instant invention, the blocking elements need not be the same type of element. For example, different types of elements may be utilized, provided they have substantially similar dynamic operating characteristics or have at least one substantially similar static operating point on their respective I-V curves. Generally, it will be simplest from a production standpoint to utilize identical elements, formed at the same time. Since in the illustrated embodiment, the two diodes associated with each storage element will be formed close in proximity to one another and will be typically formed simultaneously by common processing steps, it is very likely they will have virtually identical characteristics, including identical capacitance. With the balanced drive scheme of the present invention, only two diodes associated with each pixel need by substantially identical in order to ensure that the node between a diode pair will be at the desired common node voltage when its capacitance is being charged during the read portion of the scanning cycle. This fact allows the capacitance of each pixel or element 40 in the array to be charged to a known and repeatable voltage regardless of its location within the array, and even though the particular I-V characteristics of its diodes may vary from those of other elements in the same array. This permits improved gray scale operation in photosensitive arrays, and should make it quite possible to implement more levels of gray scale in, for example, large area matrix arrays using high-quality photogenerative elements.

The pixels and basic operating techniques of the present invention, such as those shown herein, may also be readily adapted and utilized with a photovoltaic type photogenerative element arranged to operate in its fourth quadrant. In such an embodiment, the photogenerative element charges itself during the non-read portion of the scanning when isolation devices are maintained in their nonconducting or off state. To read such an element, the charge accumulated thereon during the integration time is quickly discharged by switching the isolation devices to their conducting or on condition, and in so doing, forcing and stabilizing the voltage on the common node of the pixel to its original voltage level at the beginning of the scanning cycle, which may be zero volts, if desired. The size of resultant current pulse flowing through the photogenerative element is proportional to the integrated charge, and may be detected in the manner described above. Since the balanced circuit design and driving scheme of the present invention can drastically reduce capacitive kick effects, such pixels of the present invention should be able to accurately detect or read even the miniscule charges generated by photogenerative elements operating in their fourth quadrant.

Figure 4:
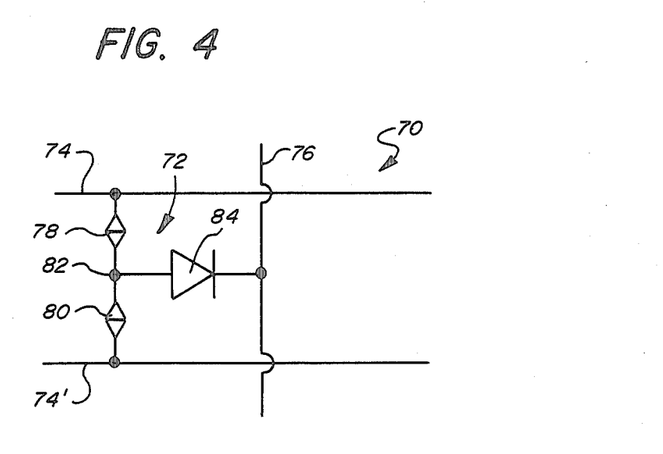
FIG. 4 is a schematic circuit diagram of a pixel of the present invention which uses threshold switches.

Referring now to FIG. 4, it illustrates one pixel location of another electronic matrix system embodying the present invention. Only one such pixel is illustrated inasmuch as it is exemplary of the many other pixels which would comprise a complete electronic matrix system.

The pixel 72 includes a row select address line pair 74, 74', and an output or column address line 76. As in the previous embodiment, the column address line 76 may cross the address line pair 74, 74' at an angle and is spaced therefrom forming a location or crossover point generally designated by the reference character 72. The pixel 72 includes a pair of threshold devices 78 and 80 which are coupled together at a common node 82 and between the row select lines 74 and 74'. The pixel 72 further includes a photogenerative element 84 represented as a photodiode, but which may be formed from any suitable photogenerative element.

The threshold devices 78 and 80 are illustrated by a symbol denoting that they are bidirectional threshold devices of the n-i-n or p-i-p type disclosed in U.S. Pat. No. 4,698,627 issued Oct. 6, 1986 and entitled "Programmable Semiconductor Switch For A Display Matrix Or The Like And Method For Making Same," or of the n-pi-n or p-nu-p type disclosed in U.S. patent application Ser. No. 720,767 filed Apr. 8, 1985 and entitled "Solid State Threshold Devices Using Punch Through". Both of these applications are hereby incorporated herein by reference. As disclosed therein, the bidirectional threshold devices 78 and 80 can be formed from regions or layers of deposited thin film semiconductor materials, such as amorphous semiconductor alloys. Preferably, the bidirectional threshold devices are formed from a pair of doped layers having a substantially intrinsic or lightly doped layer in between. Reference may be had to the two aforementioned applications for additional details of the structure of the devices and the manner of making the same.

The bidirectional threshold devices are devices which have two thresholds, the thresholds being equal in magnitude but opposite in polarity. For example, the bidirectional threshold devices can have a threshold of 4.5 volts so that each of the devices is conducting only if a voltage of +4.5 volts or greater is impressed thereacross, or if a voltage equal to or more negative that −4.5 volts is impressed thereacross.

The bidirectional devices of FIG. 4 can be used in accordance with the present invention by applying suitable voltages to lines 74 and 74', preferably voltages which are equal in magnitude and opposite in polarity with respect to the desired charging voltage to be applied to common node 82 in a manner analogous to waveforms 58 and 59 illustrated in FIG. 2. For example, during the time in which the element 84 is to be charged, +1.0 volts can be applied to the row address line 74 and a −9.0 volts can be applied to the row address line 74'. This will cause current to flow through the bidirectional threshold devices 78 and 80 to facilitate the storage of charge across the capacitance of element 84. When the read or charging time is over, the charge stored therein can be prevented from escaping through the threshold devices 78 and 80 by applying voltages to the row address lines 74 and 74' which differ in magnitude from any voltage the common node 82 may assume during the non-read portion of the scanning cycle by less than the threshold voltage of 4.5 volts. For example, during the integration time, any voltage above −4.5 volts and below +0.5 volts could be applied to the row address lines 74 and 74'. Preferably, the voltages applied to lines 74 and 74' are equal in magnitude and opposite in polarity relative to the desired common node voltage, so that the inherent capacitances of devices 78 and 80 have no net influence upon the discharging or the charge on element 84 due to optical radiation incident thereon. For example, −4.2 volts and −3.8 volts could be applied to lines 74 and 74' respectively, or alternatively, lines 74 and 74' could simply be placed or held at −4 volts.

Figure 5:
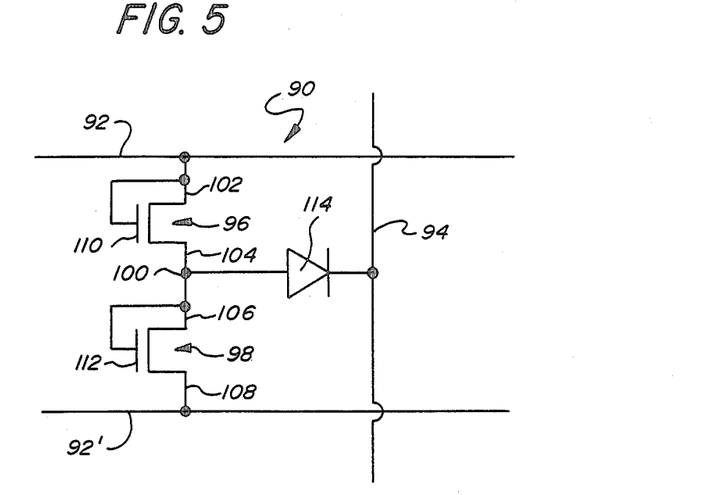
FIG. 5 is a schematic diagram of another pixel of the present invention which uses transistors.

Referring now to FIG. 5, it illustrates the pixel location 90 of another electronic matrix system embodying the present invention. Like the previous embodiments, the matrix may include a plurality of substantially parallel address line pairs such as row select lines 92 and 92' and a plurality of substantially parallel output or column lines such as column address line 94. The pixel 90 further includes a pair of isolation devices which take the form of transistors such as field effect transistors 96 and 98. The transistors 96 and 98 are coupled in series relation between the address line pair 92, 92' and at a common node 100. More specifically, the drain 102 of transistor 96 is coupled to line 92 and the source 104 is coupled to the common node 100. The drain 106 of transistor 98 is coupled to the common node 100 and the source 108 is coupled to the line 92'. The gate 110 of transistor 96 is coupled to its drain 102 and the gate 112 of transistor 98 is coupled to its drain 106. A photosensitive element such as photodiode 114 is coupled between the common node 100 and the column address line 94.

The field effect transistors 96 and 98 are preferably formed in integrated fashion, and preferably include a deposited semiconductor material such as an amorphous semiconductor alloy as the semiconductor of the devices. Details of how to construct such transistors are well known to those in the art. The transistors 96 and 98 could be either depletion mode field effect transistors or enhancement mode field effect transistors depending upon the circuits used to drive their gates.

If, for example, the transistors 96 and 98 are thin film n-channel enhancement mode field effect transistors, the photogenerative element 114 can be charged by the application of, for example, a +16 volts on line 92 and a −24 volts on line 92'. This combination of voltages, which are equal in magnitude and opposite in polarity about the desired common node voltage of −4 volts, will "forward bias", that is turn on, the transistors 96 and 98 to facilitate the charging of the element 114 by the application of either a positive or negative voltage on the column address line 94. To facilitate the retention of the stored charge, the voltages applied to the address line pair 92, 92' can be reversed such that a −24 volts is applied to line 92 and a +16 volts is applied to line 92'. These voltages which are also equal in magnitude and opposite in polarity relative to the desired common node voltage will bias the transistors 96 and 98 off to facilitate the retention of the charge stored on the element 114. Alternatively, lines 92 and 92' could simply be placed or held at zero volts, or even allowed to float at any voltage below the gate threshold voltage at which the field effect transistors 96 and 98 begin to turn on.

Those in the art will also appreciate that transistors 96 and 98 may have their gates commonly or individually connected to a suitable row driver circuit and turned on and off by low power drive signals therefrom. In such an arrangement, the row select lines 92 and 92' would preferably each be maintained continuously at a desired voltage level, such as −24 volts and +16 volts respectively, and thus serve as bus supply lines for the pixels.

While the principles of the instant invention have been described with reference to pixels including isolation means comprised of two blocking elements, it may in some instances be advantageous to utilize a larger number of blocking elements. The larger number of elements serve as part of a redundancy scheme to eliminate losses resultant from defective elements. They also provide other advantages described below.

Figure 6:
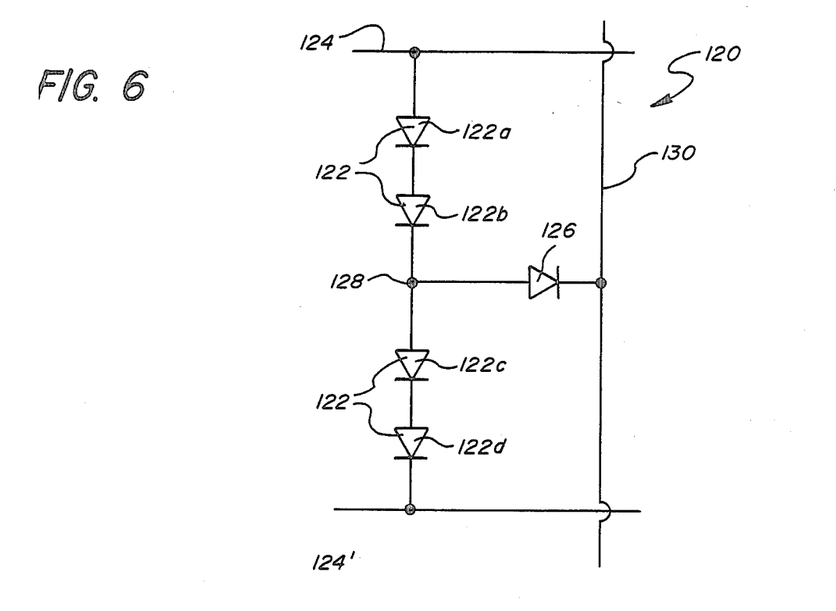
FIG. 6 is a schematic diagram of yet another pixel of the present invention which uses four isolation devices arranged in series.

Referring now to FIG. 6, there is shown a circuit diagram of a photosensitive pixel 120 which includes therein isolation means comprised of a series connected string of four blocking elements, in this instance diodes 122. The diodes 122 are disposed in a series relationship between address lines 124, 124', with two diodes on either side of the common nodal point 128. As in the foregoing examples, the pixel 120 includes a photogenerative element, in this instance a photodiode 126, disposed in electrical communication with the nodal point 128 and the column address line 130. An advantage of utilizing a circuit such as that of FIG. 6 is that if one of the diodes, for example diode 122a is defective because of a short circuit condition occurring therethrough, the pixel will not become inoperable since the other diode of the pair, in this instance, diode 122b will continue to provide the necessary isolation.

While four diodes are illustrated, it should be kept in mind that a larger or smaller number of elements may be similarly utilized. A preferred construction is to have is that the capacitances of elements arrayed about the common nodal point be substantially equal so as to mitigate capacitive kick effects. For example, three blocking elements, such diodes 122a, 122b and 122c by omitting diode 122d and connecting the cathode of diode 122c to line 124' may be employed. But in this arrangement it is preferred that the capacitance of one of the elements, namely diode 122c, be sized so as to balance the combined capacitance of the other two elements, namely diodes 122a and 122b.

While the embodiment of FIG. 6 will provide for continued operation in spite of short circuit defects, it will still be rendered inoperable by defects creating an open circuit in the string. The circuit of FIG. 7 was developed in order to obviate such problems. As depicted in the Figure, the isolation means of the pixel 140 includes two strings of diodes 122 disposed in a parallel relationship between the row address lines 124, 124'. Each string is comprised of four diodes as in the example of FIG. 6, although it should be kept in mind that an arrangement with more than two blocking elements per string may be also employed with advantage as detailed hereinabove. As in the foregoing example, the pixel 140 includes a photogenerative element which is a photodiode 126. It will be noted from the Figure that the diode 126 is electrically connected to the nodal points 128, 128' of both of the strings of isolation diodes. Because of the parallel arrangement of diode strings, a single open occurring in any one of the diodes will eliminate only half of its string from operation and isolation will still be provided by the parallel portion of the remaining string. Obviously, since each string includes four diodes, this circuit will also be tolerant of short circuit defects therein. In both the FIG. 6 and FIG. 7 embodiment, addressing or reading schemes similar to those described with reference to the foregoing embodiments may be employed.

The embodiment of FIG. 6 also has the advantage that it beneficially reduces the reverse bias voltage imposed across the individual blocking element. In pixel 22 of FIG. 1, the voltage drop across diode 34 can be twice that which occurs on photodiode 40. Since the FIG. 6 embodiment provides two diodes 122 in series in place of diode 34, the voltage to which common node 38 is charged may safely be doubled, which doubles the dynamic range at which photosensitive element 40 can be operated at. This is also true of the FIG. 7 embodiment. Another advantage of the FIG. 6 embodiment is that blocking diode 122 in series have the same basic current capacity of a single blocking diode of equivalent size, but only half the capacitance, assuming blocking diodes of equal size. Accordingly, the use of plural diodes in series connected between the row select lines and common node to which the photogenerative element is achieved beneficially reduces the effective capacitance of the isolation means, thereby reducing the capacitive kick effect.

Figure 7:
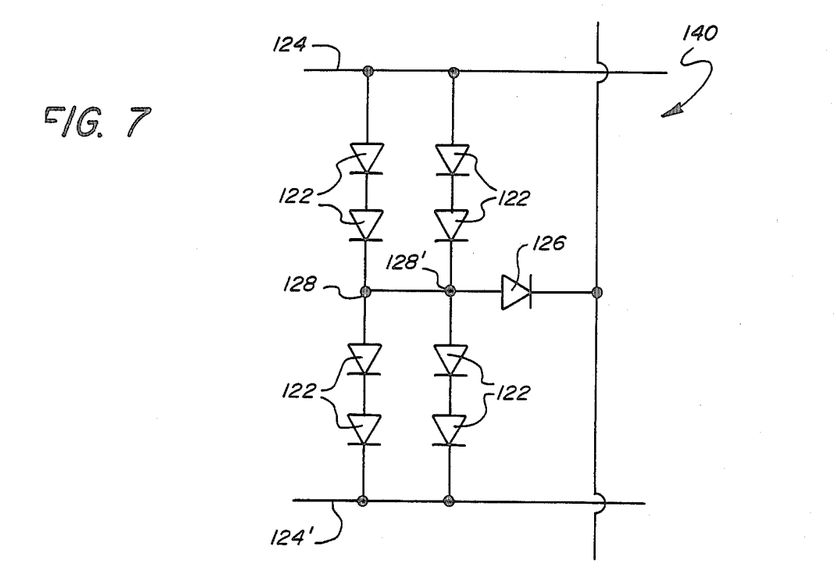
FIG. 7 is a schematic diagram of one additional pixel of the present invention having two branches or strings of isolation devices.

While the embodiments of FIGS. 6 and 7 have shown series connected strings of blocking elements as diodes, it should be appreciated that any other suitable isolation element, such as threshold switches and the like, could be employed in place of the diodes 122. The physical implementation of the examples of the present invention discussed above have been generally described with respect to deposited non-single-crystal semiconductors and other thin film materials. However, it should be appreciated that the pixels and driving schemes therefor may also be directly implemented or readily adapted for implementation using conventional crystalline or hybrid integrated circuit devices and technologies so as to produce improved crystalline or hybrid photosensitive matrix or linear arrays.

These and other modifications of the instant invention will be readily apparent to those of skill in the art. The foregoing descriptions, drawings and examples are meant to be exemplifications of some embodiments of the instant invention and not limitations upon the practice thereof. It is the followings claims, including all equivalents, which define the scope of the instant invention.

I claim:

1. A method of addressing at least one photosensitive pixel adapted to photogenerate a detectable electrical signal responsive to the quantity of radiation incident thereupon; said method comprising the steps of:
    providing a plurality of first address line pairs;
    providing a plurality of additional address lines spaced from and crossing said first address line pairs at an angle to form a plurality of cross over points therebetween;
    electrically interconnecting, in nonopposing series relation, a pair of discrete isolation means about a common nodal point and between said address line pairs; said isolation means being of the type which provide a low impedance to current flow when forward biased into an on condition;
    providing a photosensitive element between each of said nodal points and the associated additional address line;
    applying an operating potential of a given magnitude and polarity to a one of said first address line pairs and applying an operating potential substantially equal in magnitude and opposite in polarity to the other of said first address line pairs for biasing said isolation means into said on condition to facilitate the detection of the charge photogenerated by each of said photosensitive elements; and
    applying a charging potential to additional address lines during the application of said first operating potentials to said address line pairs to read the photogenerated electric charge in respective photosensitive elements.

2. A method as defined in claim 1, wherein said isolation means are also of the type which provide a high impedance to current flow when reverse biased into an off condition, and wherein said method further includes the step of applying second operating potentials which are substantially equal in magnitude and opposite in polarity to said first address line pairs to reverse bias said threshold devices into said off condition to facilitate the retention of the photogenerated charge in said pixels coupled thereto.

3. A method as defined in claim 1, wherein said photosensitive elements are selected from the group consisting of photoresistors, phototransistors, photodiodes and combinations thereof.

4. A method as defined in claim 1, wherein said isolation means comprise diodes.

5. A method as defined in claim 4, including the further step of forming said diodes by depositing layers of amorphous semiconductor alloy materials.

6. A method as defined in claim 4, wherein said diodes are formed by depositing a first layer of doped semiconductor material, depositing a layer of substantially intrinsic semiconductor material over said doped layer of semiconductor material, and depositing a second layer of doped semiconductor material over said substantially intrinsic layer of semiconductor material.

7. A method as defined in claim 6, further including the step of doping said first and second doped layers of semiconductor material so that said first and second doped layers are opposite in conductivity.

8. A method as defined in claim 1, wherein said isolation means comprises bidirectional threshold devicea.

9. A method as defined in claim 8, further including the step of forming said bidirectional threshold devices by depositing layers of substantially amorphous semiconductor alloy material.

10. A method as defined in claim 9, wherein said bidirectional threshold devices are formed by depositing a first layer of semiconductor material, depositing a second layer of semiconductor material over said first layer, and depositing a third layer of semiconductor material over said second layer.

11. A method as defined in claim 10, further including the steps of doping said first and third layers of semiconductor materials.

12. A method as defined in claim 11, wherein said first and third layers of said bidirectional threshold devices are doped to be of the same conductivity type.

13. A method as defined in claim 12, wherein said second layer is substantially intrinsic.

14. A method as defined in claim 12, including the further step of lightly doping said second layer to have a conductivity opposite the conductivity of said first and third layers.

15. A method as defined in claim 8, wherein said threshold devices comprise field effect transistors.

16. A method as defined in claim 11, wherein said step of applying said operating potentials includes commencing the application of said operating potentials after commencing the application of said charging potentials and terminating the application of said operating potentials before terminating the application of said charging potentials.

* * * * *